United States Patent
Maschera et al.

(10) Patent No.: US 9,733,276 B2
(45) Date of Patent: Aug. 15, 2017

(54) PRECISE CURRENT MEASUREMENT WITH CHOPPING TECHNIQUE FOR HIGH POWER DRIVER

(71) Applicant: NXP B.V., Eindhoven (NL)

(72) Inventors: Davide Maschera, Gratkorn (AT); Herman Johannes Effing, Nijmegen (NL)

(73) Assignee: NXP B.V., Eindhoven (NL)

( * ) Notice: Subject to any disclaimer, the term of this patent is extended or adjusted under 35 U.S.C. 154(b) by 156 days.

(21) Appl. No.: 14/954,530

(22) Filed: Nov. 30, 2015

(65) Prior Publication Data

US 2017/0153278 A1 Jun. 1, 2017

(51) Int. Cl.
*G01R 15/14* (2006.01)
*G01R 19/00* (2006.01)
*G01R 19/25* (2006.01)
*H03F 3/217* (2006.01)

(52) U.S. Cl.
CPC ......... *G01R 15/146* (2013.01); *G01R 19/003* (2013.01); *G01R 19/2513* (2013.01); *H03F 3/2171* (2013.01); *H03F 3/2173* (2013.01); *H03F 2200/456* (2013.01); *H03F 2200/462* (2013.01); *H03F 2200/474* (2013.01)

(58) Field of Classification Search
CPC .... G01R 19/2513; G05F 1/575; H03F 1/3247
See application file for complete search history.

(56) References Cited

U.S. PATENT DOCUMENTS

| 7,528,633 | B2 | 5/2009 | Jung et al. | |
|---|---|---|---|---|
| 2009/0039869 | A1* | 2/2009 | Williams | H01L 23/49575 324/123 R |
| 2013/0234687 | A1* | 9/2013 | Fujimura | G05F 1/575 323/282 |
| 2016/0124027 | A1* | 5/2016 | Sambucco | G01R 19/0092 324/76.11 |

* cited by examiner

*Primary Examiner* — Giovanni Astacio-Oquendo
*Assistant Examiner* — Alvaro Fortich
(74) *Attorney, Agent, or Firm* — Rajeev Madnawat

(57) ABSTRACT

A system for measuring high power currents, including: a low power transistor that is a scaled replica of a high power transistor of a high power driver; a regulator connected to the low power transistor, wherein the regulator is configured to regulate the current flowing through the low power transistor based upon a voltage sensed across the high power transistor and a chop signal; a current mirror with an input connected to the regulator and an output; a current detector having in input configured to receive the chop signal, wherein the current detector is connected to the output of the current mirror and wherein the current detector is configured to measure the current at the output of the current mirror to produce an estimate of the current flowing through the high power transistor.

20 Claims, 4 Drawing Sheets

PRECISE CURRENT MEASUREMENT WITH CHOPPING TECHNIQUE FOR HIGH POWER DRIVER

TECHNICAL FIELD

Various exemplary embodiments disclosed herein relate generally to precise current measurement for high power drivers including the use of chopping techniques.

BACKGROUND

High power current drivers are used in various applications requiring large drive currents. High power semiconductor switches are often used in such high current applications. The high power current driver may sense the current in such applications in order to provide accurate control of the large drive current.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a system for measuring high power currents, including: a low power transistor that is a scaled replica of a high power transistor of a high power driver; a first regulation transistor connected in series with the low power transistor; a multiplexer including a first input configured to receive a voltage from the low power transistor, a second input configured to receive a voltage from the high power transistor, a third input configured to receive a chop signal, and two outputs, wherein the multiplexer is configured to output the first input signal and the second input signal on the two outputs based upon the chop signal; a regulation amplifier with two inputs connected to the first and second outputs of the multiplexer and an output connected to a gate of the regulation transistor; a current mirror with an input connected to the regulation transistor and an output; a sensing resistor connected to the output of the current mirror; a voltage detector configured to detect a voltage across the sensing resistor and configured to produce an output that indicates the current output by the high power transistor, wherein the voltage detector has an input configured to receive the chop signal.

Various embodiments are described, wherein the voltage detector includes an analog to digital converter (ADC) and an averaging circuit.

Various embodiments are described, wherein the voltage detector compensates its output based upon gain compensation value and offset compensation value.

Various embodiments are described, wherein the voltage detector is configured to average values of the voltage detected across the sensing resistor based upon the chop signal.

Various embodiments are described, further including a second low power transistor in parallel with the second low power resistor.

Various embodiments are described, wherein a gate control signal is selectively applied to a gate of the first low power transistor and a gate of the second low power transistor.

Various embodiments are described, wherein the first low power transistor and the second low power transistor are configured to have the same current handling characteristics.

Various embodiments are described, wherein the first low power transistor and the second low power transistor are configured to have the different current handling characteristics.

Various embodiments are described, wherein a gate control signal is applied to both a gate of the first low power transistor and a gate of the second low power transistor.

Various embodiments are described, further including a system for measuring high power currents, including: a low power transistor that is a scaled replica of a high power transistor of a high power driver; a regulator connected to the low power transistor, wherein the regulator is configured to regulate the current flowing through the low power transistor based upon a voltage sensed across the high power transistor and a chop signal; a current mirror with an input connected to the regulator and an output; a current detector having in input configured to receive the chop signal, wherein the current detector is connected to the output of the current mirror and wherein the current detector is configured to measure the current at the output of the current mirror to produce an estimate of the current flowing through the high power transistor.

Various embodiments are described, wherein the estimate of the current flowing through the high power transistor is based upon a current relationship between the low power transistor and the high power transistor and a current ratio implemented by the current mirror.

Various embodiments are described, wherein the current detector including: a sensing resistor connected to the output of the current mirror; an analog to digital converter (ADC) connected to the sensing resistor configured to convert a voltage across the sensing resistor to output a digital value indicative of the current flowing through the high power transistor; and an averaging system that averages the output of the ADC based upon the chop signal to produce the estimate of the current flowing through the high power transistor.

Various embodiments are described, wherein the current detector compensates its output based upon gain compensation value and offset compensation value.

Various embodiments are described, further including a second low power transistor in parallel with the second low power resistor.

Various embodiments are described, wherein a gate control signal is selectively applied to a gate of the first low power transistor and a gate of the second low power transistor.

Various embodiments are described, wherein the first low power transistor and the second low power transistor are configured to have the same current handling characteristics.

Various embodiments are described, wherein the first low power transistor and the second low power transistor are configured to have the different current handling characteristics.

Various embodiments are described, wherein a gate control signal is applied to both a gate of the first low power transistor and a gate of the second low power transistor.

Various embodiments are described, wherein the regulator further includes: a regulator transistor connected to the input of the current mirror and the low power transistor; and a regulation amplifier having a first input and a second input configured to receive the voltage sensed across the high power transistor and the voltage sensed across the low power transistor and the regulation amplifier having an output connected to a gate of the regulation transistor.

Various embodiments are described, wherein the regulator further includes a multiplexer including a first input configured to receive voltage sensed across the low power transistor, a second input configured to receive the voltage sensed across the high power transistor, a third input configured to receive the chop signal, and two outputs, wherein the multiplexer is configured to output the first input signal and the second input signal on the two outputs based upon the chop signal, wherein the two outputs are connected to the first input and the second input of the regulation amplifier.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Large currents are often present in many applications, for example, automobile electronics and controllers, industrial systems, audio systems, etc. In many of these applications precise control of these large currents is needed. As a result high power drivers need to be able to precisely measure current in order to precisely control the current.

Figure 1:
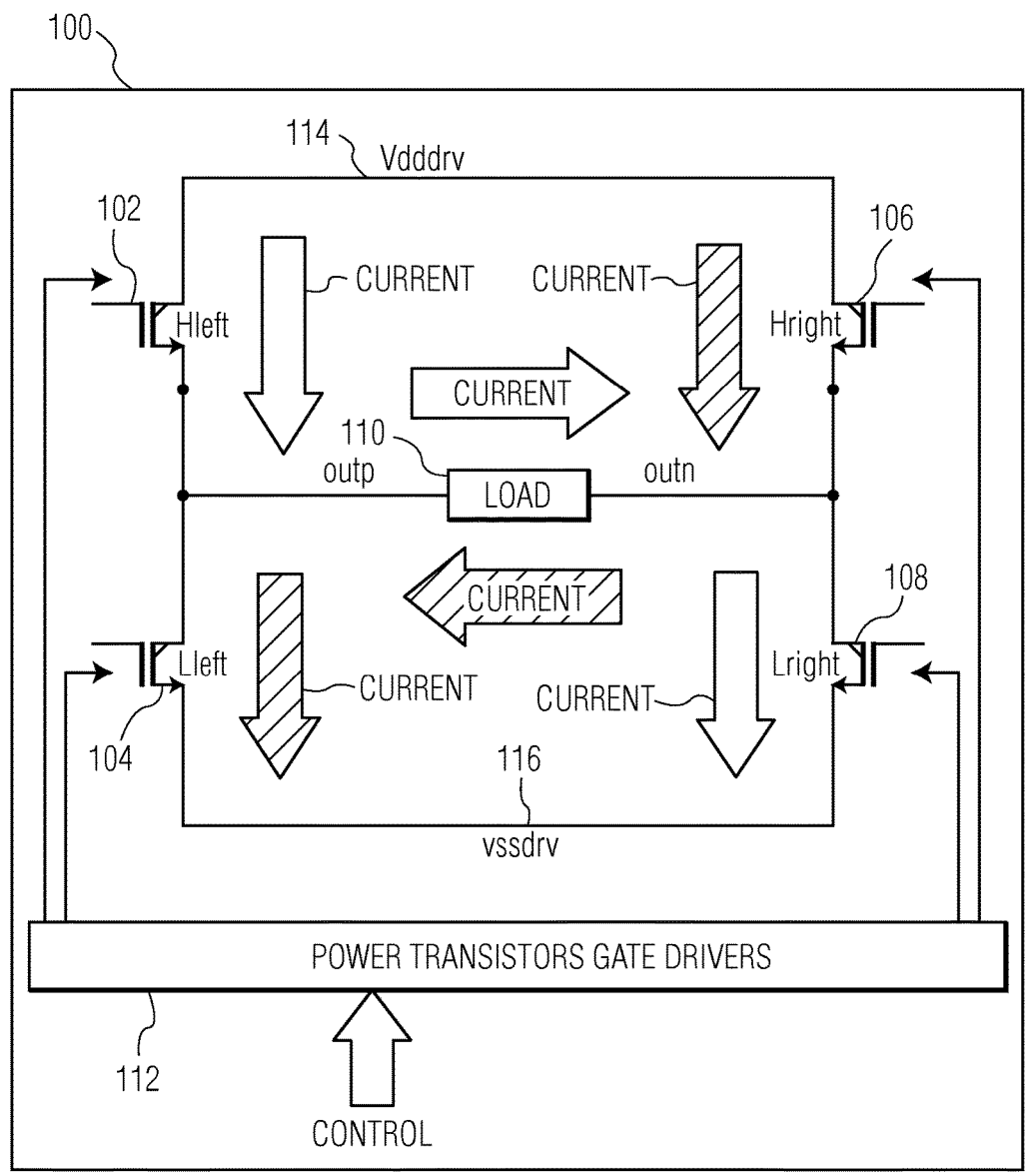
FIG. 1 illustrates a related art output stage of a high power driver.

FIG. 1 illustrates a related art output stage of a high power driver. The output stage 100 of the high power driver includes four high power transistors 102, 104, 106, 108. High power transistors are typically transistors that handle 0.5 A to 100 A or even more. High power transistors handle these high currents for driving various applications, as opposed to low power transistors that are primarily used to control the operation of the various applications without directly handling the high current. The left high power transistors 102, 104 are connected in series between voltage Vdddrv 114 and a voltage Vssdrv 116. Likewise, the right high power transistors 106, 108 are connected in series between voltage Vdddrv 114 and a voltage Vssdrv 116. As shown, the load 110 is connected between a node between the left high power transistors 102, 104 and a node between the right high power transistors 106, 108. A controller 112 provides gate drive signals to the high power transistors 102, 104, 106, 108 to control the direction of the current flowing through the load 110. A first current 118 may flow in a first direction through the load 110 when high power transistors 102 and 108 are conducting and when high power transistors 104 and 106 are closed. A second current 120 may flow in a second direction through the load 110 when high power transistors 104 and 106 are conducting and when high power transistors 102 and 108 are closed.

In order to measure current, a sensing resistor 122 may be connected between ground and Vssdrv 116. The current through the load 110 will also flow through the sensing resistor 122 resulting in voltage Vsns. The voltage Vsns can be measured by an analog to digital converter (ADC) 124 and converted to a digital signal indicating the measurement of the current through the load 110.

The current measuring system and method of FIG. 1 has a number of drawbacks. First, the maximum deliverable load current is inversely proportional to the overall impedance between the power supply rails as follows:

$$Iload_{MAX} \propto \frac{VDDDRV}{(Rsense + Zload + RDRV)},$$

where RDVR is the output resistance of the power stage, Rsense is resistance if the sensing resistor, and Zload is the impedance of the output load. Accordingly, Rsense limits the maximum deliverable load current. Second, the sensing resistor 122 has to be a high power resistor, which means increased cost and size of the overall system. Finally, the sensing resistor 122 does not allow for easy adjustment of the overall gain of the output stage.

Figure 2:
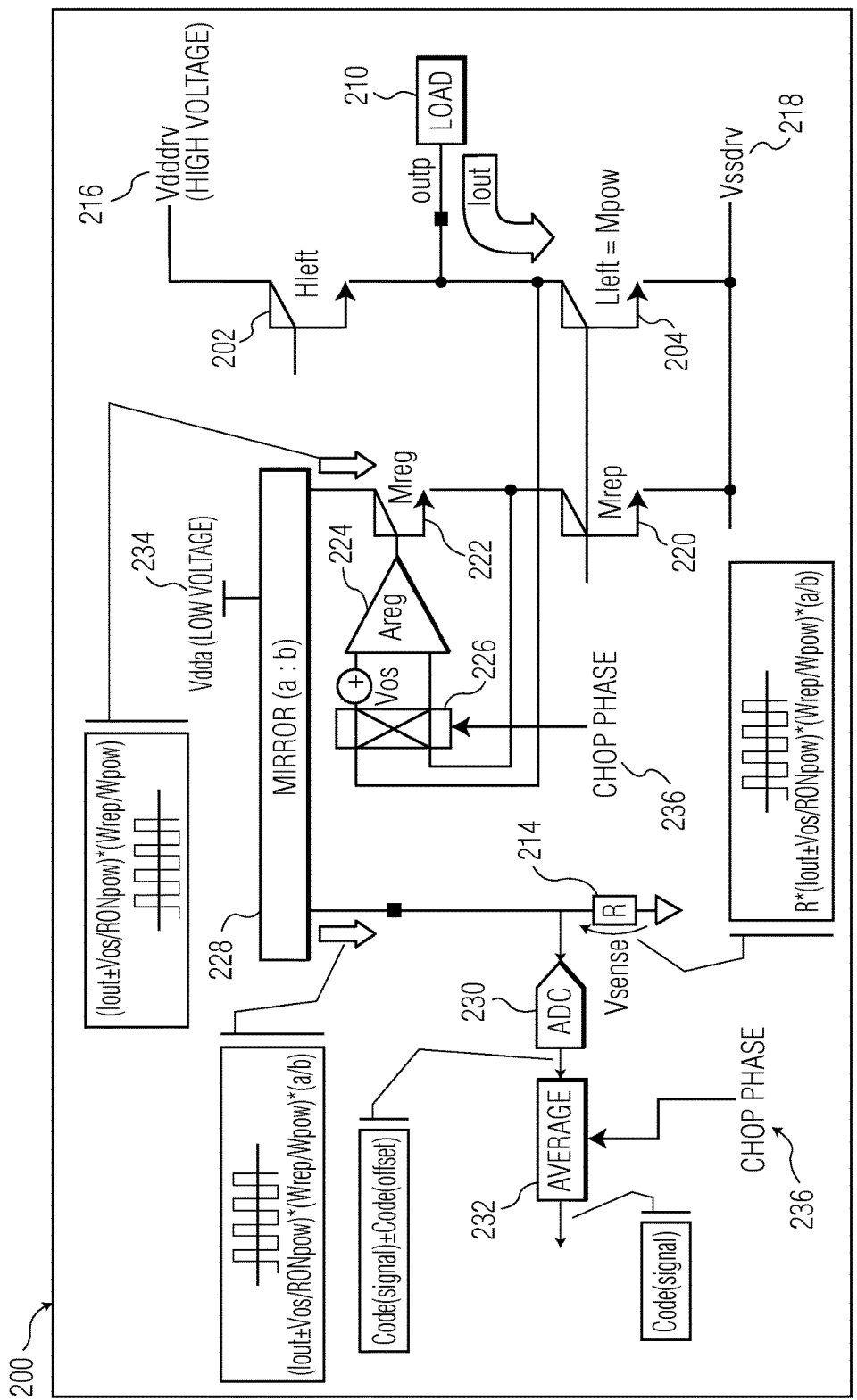
FIG. 2 illustrates an embodiment of system for measuring a large current.

FIG. 2 illustrates an embodiment of system for measuring a large current. A portion of the output stage is shown including the left high power transistors 202, 204, the load 210, and the voltages Vdddrv 216 and Vssdrv 218. The system for measuring the current includes a low power transistor 220. This low power transistor 220 is a scaled replica of the high power transistor 204. For example the width Wrep of the low power transistor 220 is smaller than the width Wpow of the high power transistor 204. When the same gate voltage and drain voltage is applied to the low power transistor 220 and the high power transistor 204, the current flowing through the low power transistor 220 is proportional to the current flowing through the high power transistor 204 and is specified by the characteristics of the low power transistor 220 and the high power transistor 204, for example, Wrep/Wpow. A gate control signal 242 may be provided by a controller (not shown) to control gates of the low power transistor 220 and the high power transistor 204 together.

A regulator 206 includes a regulation amplifier 224, regulation transistor 224, and a multiplexer 226. The regulator 206 controls the voltage applied across the low power transistor 220 and the current through the low power transistor 220. The regulation amplifier 224 senses the drain voltages of the high power transistor 204 and the low power transistor 220. The regulation amplifier 224 produces a voltage that then controls the regulation transistor 222 to thereby affect the voltage applied across the low power transistor 220, and the regulation amplifier 224 will continue to adjust the regulation transistor 222 until the voltage across the low power transistor 220 and the high power transistor 204 are the same. It is noted that the regulation amplifier 224 introduces an error term due to a bias in the amplifier. Accordingly, a multiplexer 226 is used to swap the inputs to the regulation amplifier 224 based upon a chopping phase signal 236. The multiplexer has two inputs and two outputs. When the chop phase is in a first state a first input is connected to a first output, and a second input is connected to a second output. When the chop phase is in a second state the first input is connected to the second output, and the second input is connected to the first output. As will be described in further detail below, this causes the amplifier error to be added and subtracted from the output signal that can then be averaged out.

The system for measuring the current further includes a current mirror 228. The current mirror 228 is connected between a low voltage source Vdda 234 and the regulation transistor 222. The current mirror 228 produces a mirrored current 238 that mirrors the low power current 240 that is flowing through the low power transistor 220. The current mirror 228 is a circuit designed to copy a current through one active device by controlling the current in another active device of a circuit, keeping the output current constant regardless of loading. The current mirror 228 causes the ratio between the mirrored current 238 and the low power current 240 to be a/b. The mirrored current 228 is proportional to the high power current flowing through the high power transistor 204.

A current sensor 208 may include a sensing resistor 214, an ADC 230, and an averaging circuit 232. The sensing resistor 214 receives the mirrored current 238 to produce a voltage Vsns. As before the ADC 230 may measure the voltage produced across the sensing voltage. The output of the ADC indicates the current flowing through the high power transistor 204. The sensing resistor 214, the ADC 230, and the averaging circuit 232 may be a current detector.

The voltage across the sensing resistor 214 may be calculated as follows:

$$Vsns=Rsense*(Iout \pm Vos/RONpow)*Wrep/Wpow*a/b,$$

Where Vsns is the voltage across the sensing resistor 214, Iout is the current through the load 210, Vos is the voltage offset error of the regulation amplifier 224, and RONpow is the resistance of the power transistor 204. Note the presence of the ±before the Vos/RONpow term. This indicates that as the multiplexer 226 swaps the inputs to the regulation amplifier 224, and this effects the sign of the current contribution due to the regulation amplifier voltage offset error, i.e., it is added and subtracted. The error term due to Vos/RONpow may depend on the temperature of the system, and it may lead to a significant error in sensing the output current, especially when the output current is low. This may lead to errors in the measurement of the output current, but may also affect the dynamic range of the possible output current measurements.

Figure 3:
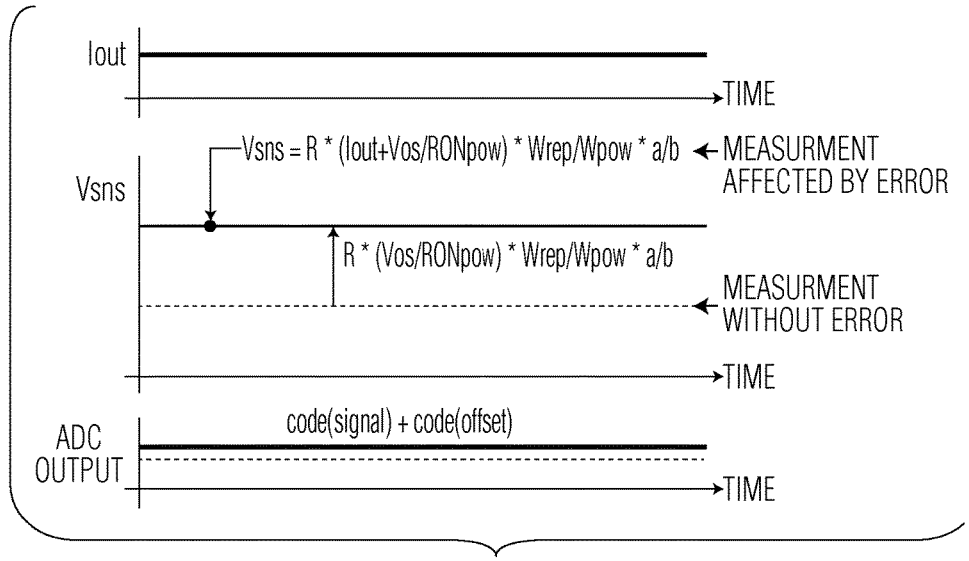
FIG. 3 includes plots illustrating the effect of the regulation amplifier voltage offset error.

A chopping technique will now be described that compensates for the amplifier regulator error. FIG. 3 includes plots illustrating the effect of the regulation amplifier voltage offset error. The top plot shows the output current. The second plot shows the value of the voltage Vsns across the sensing voltage and how it compares to the ideal voltage without the error due to the regulation amplifier. The third plot shows the output of the ADC 230 where the error shows up in the output of the ADC 230 relative to the ideal output of the ADC 230.

Figure 4:
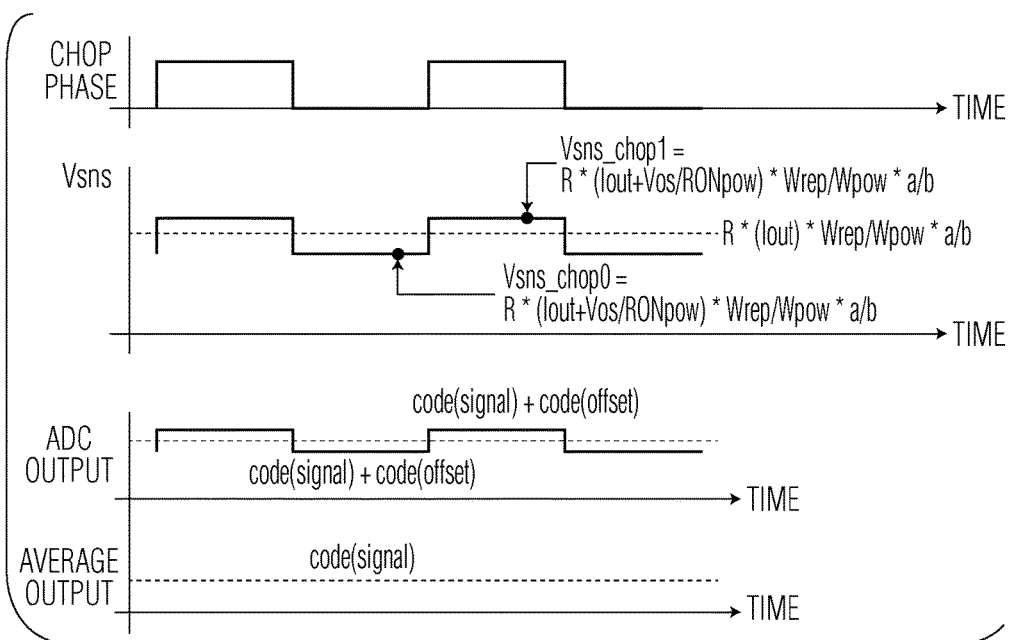
FIG. 4 includes plots showing the effect of applying a chopping phase in the current measurement system.

FIG. 4 includes plots showing the effect of applying a chopping phase in the current measurement system. The first plot in FIG. 4 shows the chop phase 236. This chop phase signal 236 is applied to the multiplexer 226 as shown in FIG. 2. Further, an averaging circuit 232 also receives the chop phase signal 236 and the output of the ADC 230. The second plot shows the value of Vsns now that the chop phase signal 236 has been applied to the multiplexer 226. As can be seen, the value of Vsns now alternates about the ideal Vsns value by the regulation amplifier voltage offset error based upon the multiplexer 226 swapping the inputs to the regulation amplifier 224 based upon the chop phase signal 236. The third plot is the output of the ADC 230 and shows how the output of the ADC also now alternates about the ideal output. The averaging circuit receives the output of the ADC 230 and the chop phase signal 236, and averages the output of the ADC 230 to result in an output that greatly reduces the effects of the regulation amplifier voltage offset error. The combination of the ADC 230 and the averaging circuit 232 may be combined into a single voltage detector. It is noted that the averaging of the voltage Vsns also may be done using an analog circuit before the ADC converts the voltage Vsns to a digital value.

Figure 5:
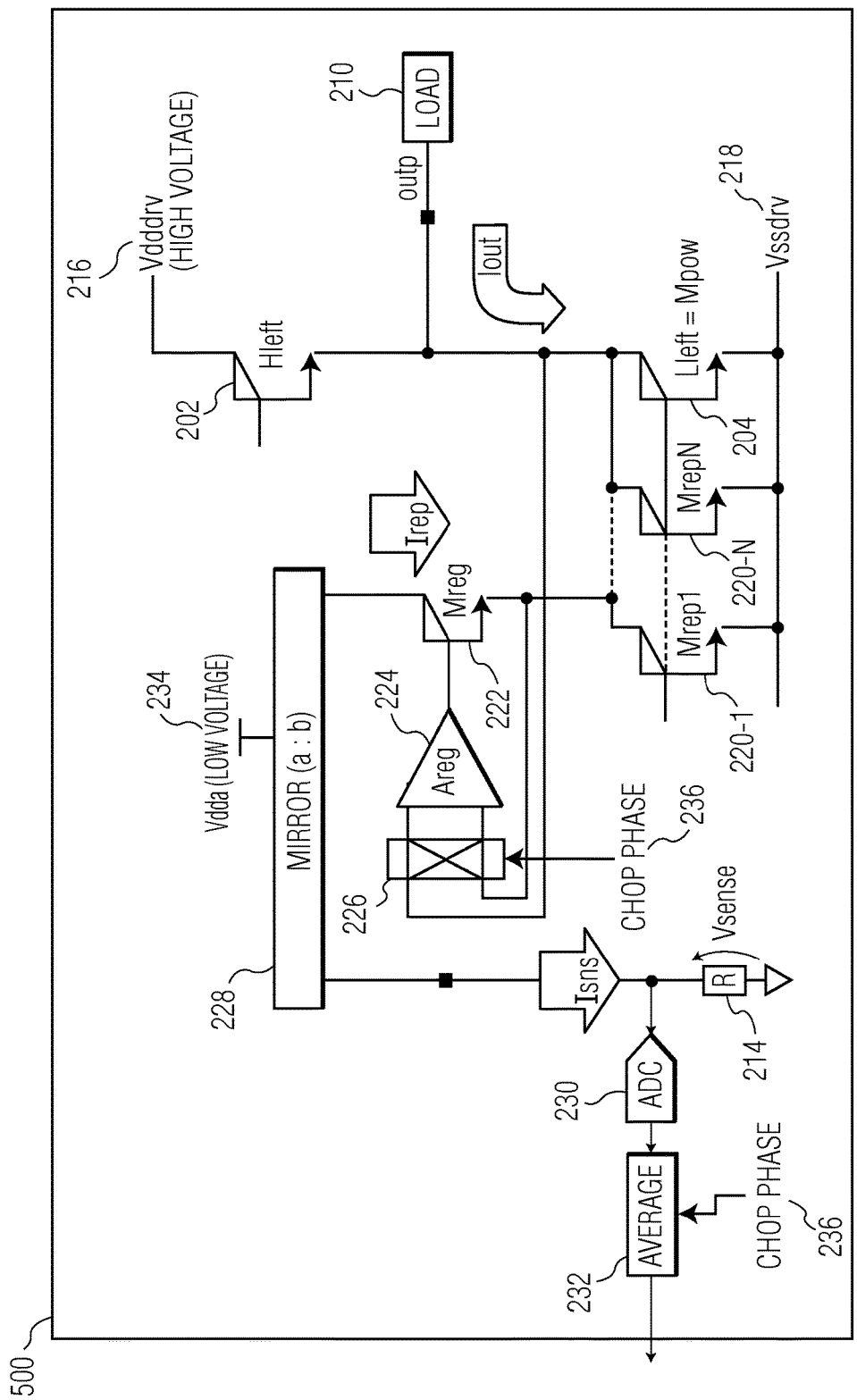
FIG. 5 illustrates another embodiment of a system for measuring a large current.

FIG. 5 illustrates another embodiment of a system for measuring a large current. As mentioned above such large current may occur, for example, in the signal used to drive a mechanical actuator in an automobile such as a brake or steering system. The system of FIG. 5 is the same as the system of FIG. 2, except that there are multiple low power transistors 220-1 to 220-N. These low power transistors 220 may have the same or differing values of Wrep. During operation various combinations of these low power transistors 220 may be used in measuring the output current to provide different values of Wrep and hence allowing for the flexibility of adjusting the value of Wrep based upon the value of the output current. This may improve the dynamic range of the measurement. As these low power transistors 220 are connected in parallel, the value of Wrep for the combination of low power transistors 220 is the sum of the Wrep for each of the low power transistors 220. The values of Wrep for each of the low power transistors 220 may be selected in order to accommodate the range of output currents expected. A controller (not shown) may apply control signals to various low power transistors to effect the desired value of Wrep.

Because there are certain non-ideal aspects of the embodiments described above, further compensation may be applied to further improve the current measurements. The sense voltage may be described using the following equation:

$$Vsns=Rsense*(Iout+Ios)*IgainPR*a/b,$$

where IgainPR represents the gain of the coupling between the low power transistor 220 and the high power transistor 204. The following non-ideal characteristics may degrade the accuracy of the sensing: mismatch inside the mirror a:b; and mismatch between the coupling of the low power transistor 220 and the high power transistor 204 where IgainPR depends on the mismatch and on the output current.

The following steps may be taken in order to reduce the effects of these non-ideal characteristics.

First, extract the gain and offset of the current measurement system during system product using accurate test currents. Inject a first test current itest1 on the current output terminal and read the value of Vsns during the two phases of the chop phase signal. Then calculate:

$$V\text{sens1\_avg} = (V\text{sns\_chop0} + V\text{sns\_chop1})/2.$$

Next, inject a second test current itest2 on the current output terminal and read the value of Vsns during the two phases of the chop phase signal. Then calculate:

$$V\text{sns2\_avg} = (V\text{sns\_chop0} + V\text{sns\_chop1})/2.$$

Next, calculate the gain and offset of the sensing circuit as follows:

$$m = (V\text{sns2\_avg} - V\text{sns1\_avg})/(i\text{test2} - i\text{test1});\text{ and}$$

$$q = V\text{sns2\_avg} - m * i\text{test2}.$$

The values m and q may be stored on the current measurement systems memory, and the values m and q may be used to estimate Tout versus the sense voltage as follows:

$$I\text{out,est} = (V\text{sns\_avg} - q)/m/C(I\text{out}),$$

where C(Iout) represents a compensation factor that compensates for the current dependency of IgainPR.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A system for measuring high power currents, comprising:
    a low power transistor that is a scaled replica of a high power transistor of a high power driver;
    a first regulation transistor connected in series with the low power transistor;
    a multiplexer including a first input configured to receive a voltage signal from the low power transistor, a second input configured to receive a voltage signal from the high power transistor, a third input configured to receive a chop signal, and two outputs, wherein the multiplexer is configured to output the first input voltage signal and the second input voltage signal on the two outputs based upon the chop signal;
    a regulation amplifier with two inputs connected to the first and second outputs of the multiplexer and an output connected to a gate of the first regulation transistor;
    a current mirror with an input connected to the first regulation transistor and an output;
    a sensing resistor connected to the output of the current mirror;
    a voltage detector configured to detect a voltage across the sensing resistor and configured to produce an output that indicates a current output by the high power transistor, wherein the voltage detector has an input configured to receive the chop signal.

2. The system of claim 1, wherein the voltage detector includes an analog to digital converter (ADC) and an averaging circuit.

3. The system of claim 1, wherein the voltage detector compensates its output based upon gain compensation value and offset compensation value.

4. The system of claim 1, wherein the voltage detector is configured to average values of the voltage detected across the sensing resistor based upon the chop signal.

5. The system of claim 1, further comprising a second low power transistor in parallel with a second low power resistor.

6. The system of claim 5, wherein a gate control signal is selectively applied to a gate of the first low power transistor and a gate of the second low power transistor.

7. The system of claim 5, wherein the first low power transistor and the second low power transistor are configured to have the same current handling characteristics.

8. The system of claim 5, wherein the first low power transistor and the second low power transistor are configured to have the different current handling characteristics.

9. The system of claim 5, wherein a gate control signal is applied to both a gate of the first low power transistor and a gate of the second low power transistor.

10. A system for measuring high power currents, comprising:
    a low power transistor that is a scaled replica of a high power transistor of a high power driver;
    a regulator connected to the low power transistor, wherein the regulator is configured to regulate a current flowing through the low power transistor based upon a voltage sensed across the high power transistor and a chop signal;
    a current mirror with an input connected to the regulator and an output;
    a current detector having an input configured to receive the chop signal, wherein the current detector is connected to the output of the current mirror and wherein the current detector is configured to measure a current at the output of the current mirror to produce an estimate of a current flowing through the high power transistor.

11. The system of claim 10, wherein the estimate of the current flowing through the high power transistor is based upon a current relationship between the low power transistor and the high power transistor and a current ratio implemented by the current mirror.

12. The system of claim 11, wherein the current detector comprises:
    a sensing resistor connected to the output of the current mirror;
    an analog to digital converter (ADC) connected to the sensing resistor configured to convert a voltage across the sensing resistor to output a digital value indicative of the current flowing through the high power transistor; and
    an averaging system that averages an output of the ADC based upon the chop signal to produce the estimate of the current flowing through the high power transistor.

13. The system of claim 10, wherein the current detector compensates its output based upon gain compensation value and offset compensation value.

14. The system of claim 10, further comprising a second low power transistor in parallel with a second low power resistor.

15. The system of claim 14, wherein a gate control signal is selectively applied to a gate of the first low power transistor and a gate of the second low power transistor.

16. The system of claim 14, wherein the first low power transistor and the second low power transistor are configured to have the same current handling characteristics.

17. The system of claim 14, wherein the first low power transistor and the second low power transistor are configured to have the different current handling characteristics.

18. The system of claim 14, wherein a gate control signal is applied to both a gate of the first low power transistor and a gate of the second low power transistor.

19. The system of claim 10, wherein the regulator further comprises:
- a regulator transistor connected to the input of the current mirror and the low power transistor; and
- a regulation amplifier having a first input and a second input configured to receive the voltage sensed across the high power transistor and a voltage sensed across the low power transistor and the regulation amplifier having an output connected to a gate of the regulation transistor.

20. The system of claim 19, wherein the regulator further comprises a multiplexer including a first input configured to receive voltage signal sensed across the low power transistor, a second input configured to receive the voltage signal sensed across the high power transistor, a third input configured to receive the chop signal, and two outputs, wherein the multiplexer is configured to output the first input voltage signal and the second input voltage signal on the two outputs based upon the chop signal, wherein the two outputs are connected to the first input and the second input of the regulation amplifier.

\* \* \* \* \*